United States Patent
Ebihara et al.

(10) Patent No.: US 12,199,632 B2
(45) Date of Patent: Jan. 14, 2025

(54) DYNAMIC CURRENT CONTROL FOR COLUMN ADC

(71) Applicant: OMNIVISION TECHNOLOGIES, INC., Santa Clara, CA (US)

(72) Inventors: Hiroaki Ebihara, San Jose, CA (US); Chengcheng Xu, Santa Clara, CA (US); Satoshi Sakurai, Cupertino, CA (US); Kenny Geng, Mountain View, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 176 days.

(21) Appl. No.: 18/176,373

(22) Filed: Feb. 28, 2023

(65) Prior Publication Data

US 2024/0291499 A1    Aug. 29, 2024

(51) Int. Cl.
H03M 1/46        (2006.01)
(52) U.S. Cl.
CPC ........... H03M 1/466 (2013.01); H03M 1/462 (2013.01)
(58) Field of Classification Search
CPC ......... H03M 1/46; H03M 1/462; H03M 1/466
See application file for complete search history.

(56) References Cited

U.S. PATENT DOCUMENTS

| | | | |
|---|---|---|---|
| 9,774,811 B1 * | 9/2017 | Ebihara ................... | H03K 5/249 |
| 10,437,120 B1 * | 10/2019 | Jutamulia ............ | G09G 3/2007 |
| 10,694,134 B2 | 6/2020 | Kim et al. | |
| 10,924,701 B2 | 2/2021 | Ebihara et al. | |
| 10,965,897 B2 | 3/2021 | Kim | |
| 11,140,352 B1 * | 10/2021 | Dai ........................ | H04N 25/78 |
| 11,206,039 B1 * | 12/2021 | Ebihara ............... | H03M 1/1295 |
| 11,240,455 B2 | 2/2022 | Yamashita et al. | |
| 11,463,648 B1 * | 10/2022 | Xu ........................ | H04N 25/134 |
| 11,722,801 B1 * | 8/2023 | Ebihara .................. | H04N 25/75 |
| | | | 348/308 |
| 11,843,884 B1 * | 12/2023 | Zou ........................ | H04N 25/77 |
| 2012/0274489 A1 * | 11/2012 | Chang ................... | H03M 1/462 |
| | | | 341/110 |
| 2018/0091752 A1 * | 3/2018 | Ebihara .................. | H04N 25/78 |
| 2018/0302578 A1 * | 10/2018 | Ebihara ............... | H01L 27/1255 |
| 2018/0324378 A1 * | 11/2018 | Ebihara ............... | H03K 5/2481 |

(Continued)

FOREIGN PATENT DOCUMENTS

WO        2018021055 A1    2/2018

*Primary Examiner* — Lam T Mai
(74) *Attorney, Agent, or Firm* — PERKINS COIE LLP

(57) ABSTRACT

A tail current source of a comparator includes a first transistor and a second transistor configured to operate as current sources, wherein the first and second transistors are coupled between a tail node of the comparator and a voltage node, and wherein the tail comprises a node coupled to first and second inputs of the comparator. The tail current source also includes a switch configured to selectively couple the second transistor between the tail and the voltage node, and a bias voltage source coupled to gates of the first and second transistors. The switch is configured to be on during an analog-to-digital conversion (ADC) reset signal period and an ADC image signal period, and the switch is configured to be off during an auto-zero period, a period between the ADC reset signal and image signal periods, and a period after the ADC image signal period.

28 Claims, 14 Drawing Sheets

(56) References Cited

U.S. PATENT DOCUMENTS

| | | | | |
|---|---|---|---|---|
| 2018/0324379 | A1* | 11/2018 | Ebihara | H04N 25/75 |
| 2020/0396403 | A1* | 12/2020 | Ebihara | H04N 25/75 |
| 2021/0258563 | A1* | 8/2021 | Zhan | G01R 31/56 |
| 2022/0201231 | A1* | 6/2022 | Ebihara | H04N 25/75 |
| 2023/0336165 | A1* | 10/2023 | Sun | H04N 25/75 |
| 2023/0336891 | A1* | 10/2023 | Ebihara | H03K 5/24 |
| 2024/0283460 | A1* | 8/2024 | Wang | H04N 25/77 |
| 2024/0284074 | A1* | 8/2024 | Wang | H04N 25/75 |
| 2024/0291499 | A1* | 8/2024 | Ebihara | H03M 1/466 |

* cited by examiner

DYNAMIC CURRENT CONTROL FOR COLUMN ADC

TECHNICAL FIELD

This disclosure relates generally to image sensors, and in particular but not exclusively, relates to complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
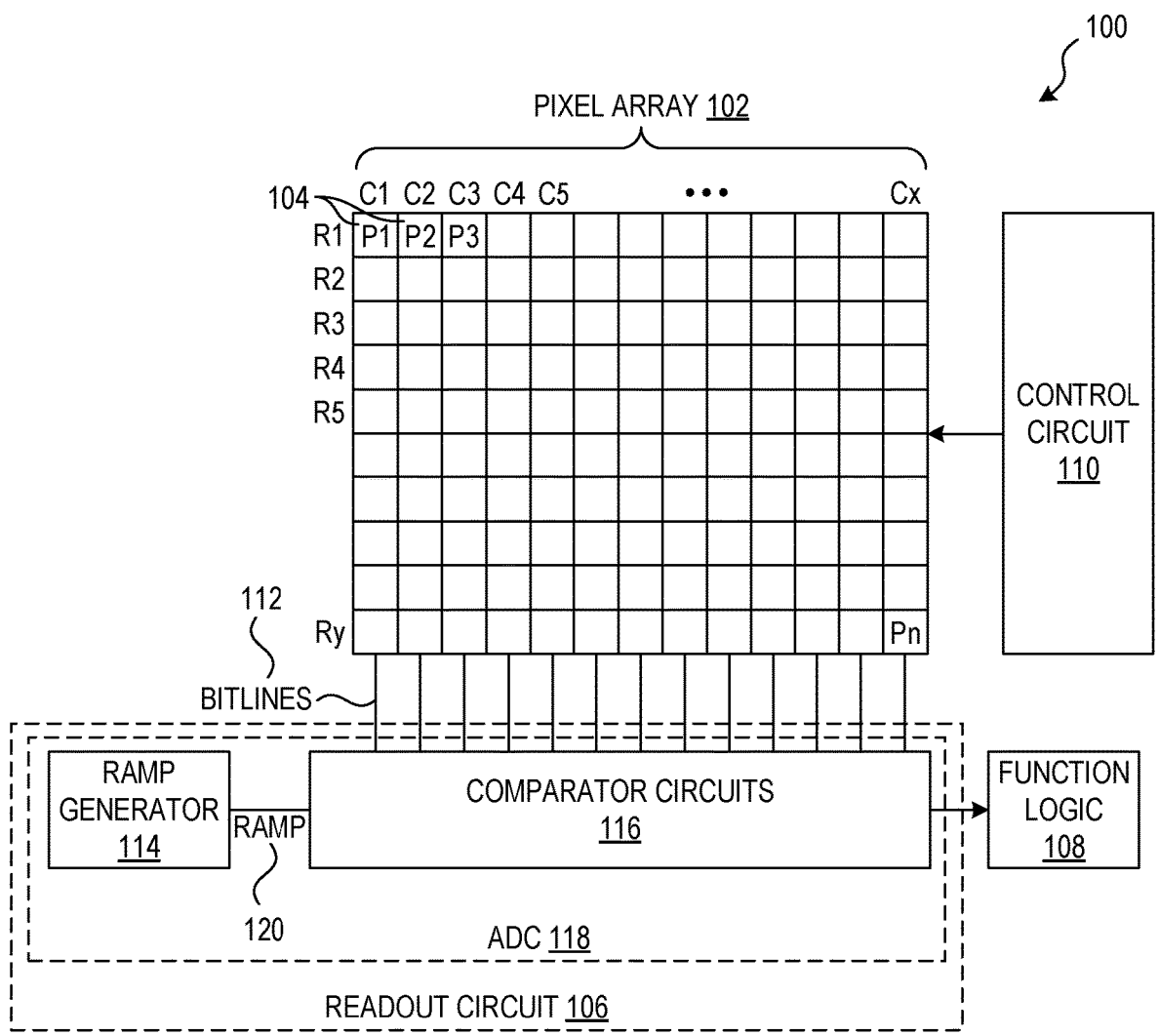
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a tail current source in a comparator of a pixel cell readout circuit providing reduced average power consumption. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a tail current source in a comparator of a pixel cell readout circuit providing reduced average power consumption are disclosed. In various examples, a tail current source is configured to generate a tail current that is at a high value only during analog-to-digital conversion (ADC) signal readout periods (e.g., reset signal, image signal). In various examples, the tail current is at a high value also during a short period before each ADC signal readout period.

There has long been a demand for low-power readout circuits for CMOS image sensors. In particular, the demand for both higher resolution and higher frame rates has been increasing in recent years. It is therefore increasingly important that new image sensors be capable of reading out a greater number of pixels per second. However, conventional configurations and methods for doing so increase power consumption. There is a need for a more efficient ADC readout circuit that can reduce the power consumption per pixel readout.

In various examples of the present disclosure, a tail current source of a comparator comprises two transistors acting as current sources and together provide a total tail current. Each transistor is selectively coupled to the rest of the comparator (e.g., at the tail node of the comparator) and a voltage node such as ground or a power line (e.g., VDD) via a switch. The switches control when each of the two transistors are on, thereby controlling the total tail current.

To illustrate, FIG. 1 shows one example of an imaging system 100 having a readout circuit 106 including a comparator providing reduced average power consumption in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., RI to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. As will be discussed, in the various examples, readout circuit 106 may include an analog-to-digital converter (ADC) 118. As shown in the depicted example, the ADC 118 coupled to column bitlines 112 is configured to convert analog signals from column bitlines 112 to digital signals. In various examples, column amplifiers may also be included and may be coupled to column bitlines 112 to amplify the analog signals received from column bitlines 112 for conversion to digital signals by ADC 118. In various examples, the ADC 118 includes a ramp generator 114 and comparator circuits 116. The ramp generator 114 has a ramp generator output from which a ramp signal 120 is provided to the comparator circuits 116. In the example, the digital image data values generated by the comparator circuits 116 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
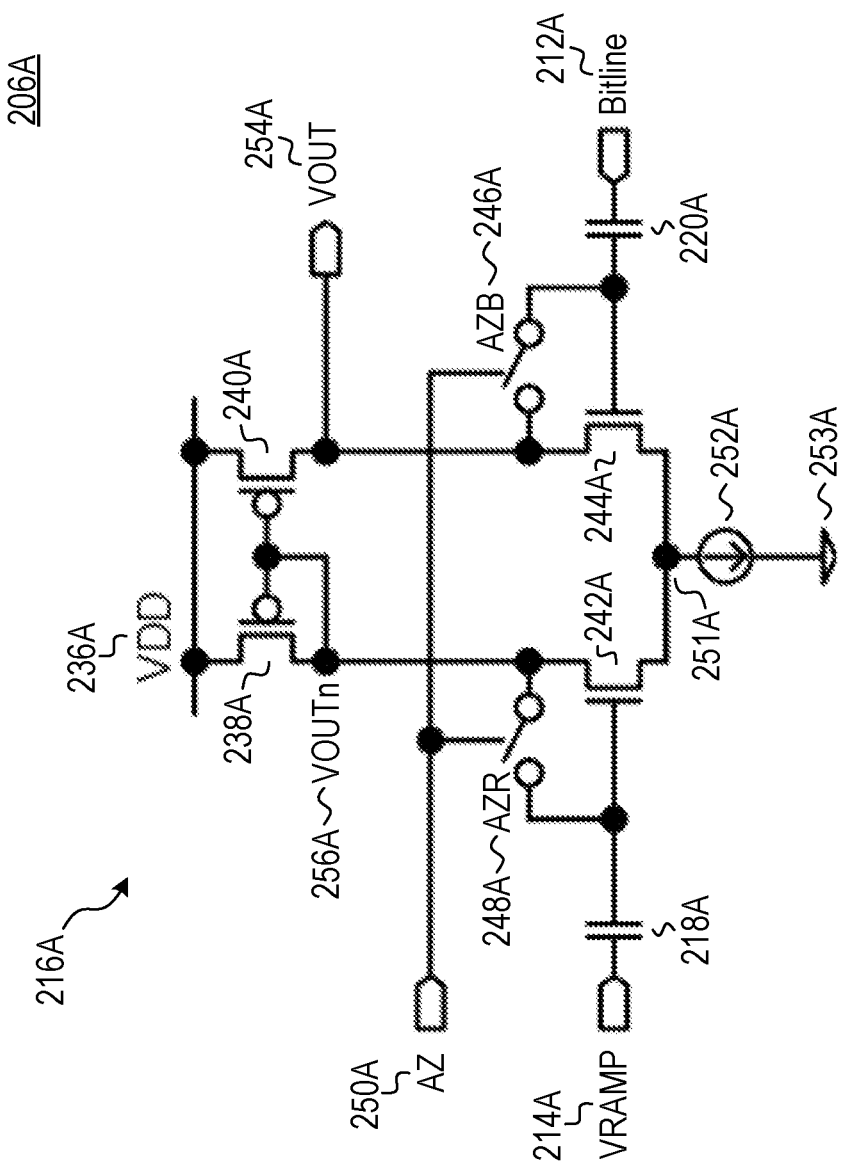
FIG. 2A illustrates a schematic of one example of a readout circuit including a comparator in accordance with the teachings of the present disclosure.

FIG. 2A illustrates a schematic of one example of a readout circuit 206A in accordance with the teachings of the present disclosure. It is appreciated that the readout circuit 206A of FIG. 2A may be an example of the readout circuit 106 included in the imaging system 100 as shown in FIG. 1, and that similarly named and numbered elements described above are coupled and function similarly below.

The readout circuit 206A includes a comparator 216A with a first input coupled to a ramp generator output VRAMP 214A and a second input coupled to a bitline 212A. In the depicted example, it is appreciated that the first input of the comparator 216A is the gate of transistor 242A and the second input of the comparator 216A is the gate of transistor 244A. As shown, the comparator 216A includes transistors 238A and 240A coupled to a power line or voltage source VDD 236A and to each other as a current mirror. As shown in the depicted example, transistors 238A and 240A are implemented with PMOS transistors. The first input transistor 242A is coupled to transistor 238A, and the second input transistor 244A is coupled to transistor 240A. As shown in the depicted example, transistors 242A and 244A are implemented with NMOS transistors. A tail node 251A of the comparator 216A is a node coupled to the sources of transistors 242A and 244A. A tail current source 252A is coupled between the tail node 251A and a voltage node 253A, which as shown in the depicted example is coupled to ground.

In the illustrated example, a first AC coupling capacitor 218A is coupled between the ramp generator output VRAMP 214A and the gate of transistor 242A. The first AC coupling capacitor 218A is also selectively coupled to the drain of transistor 242A via a ramp auto-zero switch AZR 248A. In addition, a second AC coupling capacitor 220A is coupled between the bitline 212A and transistor 244A. The second AC coupling capacitor 220A is also selectively coupled to the drain of transistor 244A via a bitline auto-zero switch AZB 246A. In the illustrated example, the auto-zero switches AZR 248A and AZB 246A are simultaneously controlled by an auto-zero signal AZ 250A. In various examples, the auto-zero switches AZR 248A and AZB 246A can be independently controlled by two separate auto-zero signals.

The comparator 216A has an output voltage VOUT 254A from the node between the drains of transistors 240A and 244A. In various examples, the signal from the output voltage VOUT 254A controls a counter. The comparator 216A also has an output voltage node VOUTn 256A from the node between the drains of transistors 238A and 242A.

Figure 2B:
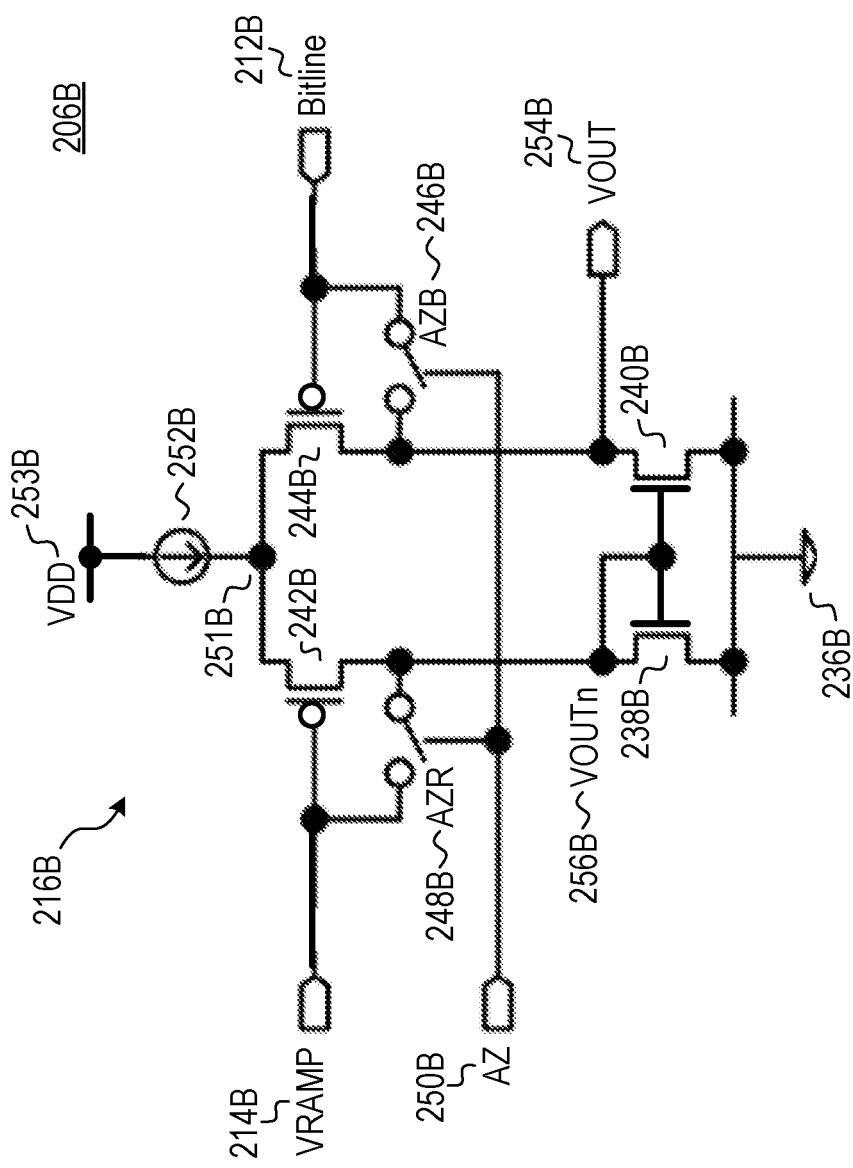
FIG. 2B illustrates a schematic of another example of a readout circuit including a comparator in accordance with the teachings of the present disclosure.

FIG. 2B illustrates a schematic of another example of a readout circuit 206B in accordance with the teachings of the present disclosure. It is appreciated that the readout circuit 206B of FIG. 2B may be another example of the readout circuit 106 included in the imaging system 100 as shown in FIG. 1, and that similarly named and numbered elements described above are coupled and function similarly below. It is further appreciated that readout circuit 206B of FIG. 2B shares many similarities with readout circuit 206A of FIG. 2A. As can be appreciated in the various examples having the benefit of the teachings of the present disclosure, the designs of comparators 216A and comparators 216B of FIGS. 2A-2B may choose to utilize P-type transistors (e.g., PMOS) and/or N-type transistors (e.g., NMOS) as appropriate.

In particular, as shows in the example depicted in FIG. 2B, the readout circuit 206B includes a comparator 216B with a first input coupled to a ramp generator output VRAMP 214B and a second input coupled to a bitline 212B. In various examples, it is appreciated that the second input may be coupled to bitline 212B through a column amplifier, which may be configured to amplify analog signals in the bitline 212B. In the depicted example, it is appreciated that the first input of the comparator 216A is the gate of transistor 242B and the second input of the comparator 216B is the gate of transistor 244B. As shown, the comparator 216B includes transistors 238B and 240B coupled to ground 236B and to each other as a current mirror. As shown in the depicted example, transistors 238B and 240B are implemented with NMOS transistors. The first input transistor 242B is coupled to transistor 238B, and the second input transistor 244B is coupled to transistor 240B. As shown in the depicted example, transistors 242B and 244B are implemented with PMOS transistors. A tail node 251B of the comparator 216B is a node coupled to the sources of transistors 242B and 244B. A tail current source 252B is coupled between the tail node 251B and a voltage node 253B, which as shown in the depicted example is coupled to a power line or voltage source VDD 253B.

In the illustrated example, a ramp auto-zero switch AZR 248B may be coupled between the gate and drain of transistor 242B and a bitline auto-zero switch AZB 246B is coupled between the gate and drain of transistor 244B. In the illustrated example, the auto-zero switches AZR 248B and AZB 246B are simultaneously controlled by an auto-zero signal AZ 250B. In various examples, the auto-zero switches AZR 248B and AZB 246B may be independently controlled by two separate auto-zero signals.

The comparator 216B has an output voltage VOUT 254B from the node between the drains of transistors 240B and 244B. In various examples, the signal from the output voltage VOUT 254B controls a counter. The comparator 216B also has an output voltage node VOUTn 256B from the node between the drains of transistors 238B and 242B.

Figure 3A:
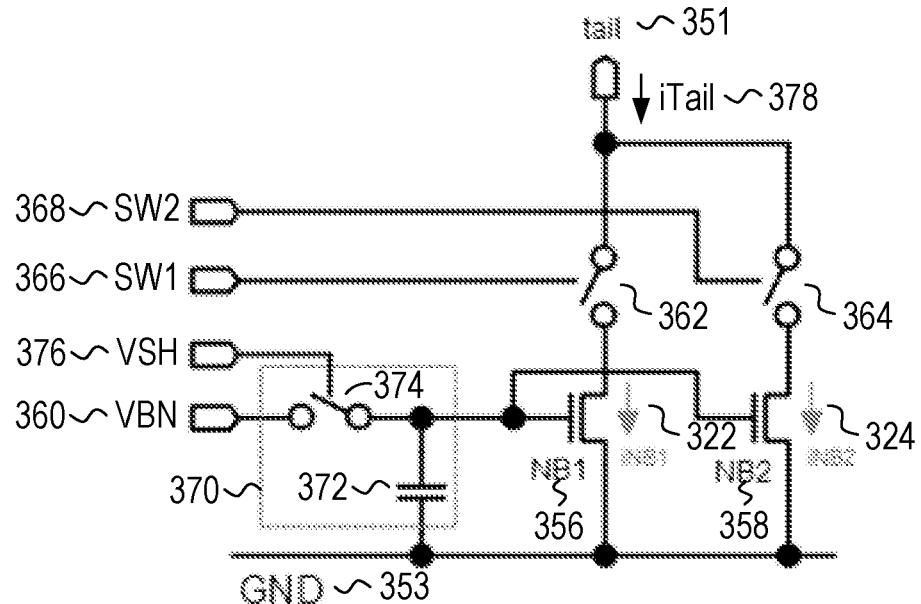
FIGS. 3A and 3B illustrate schematics of two examples of a tail current source of a comparator in accordance with the teachings of the present disclosure.
Figure 3B:
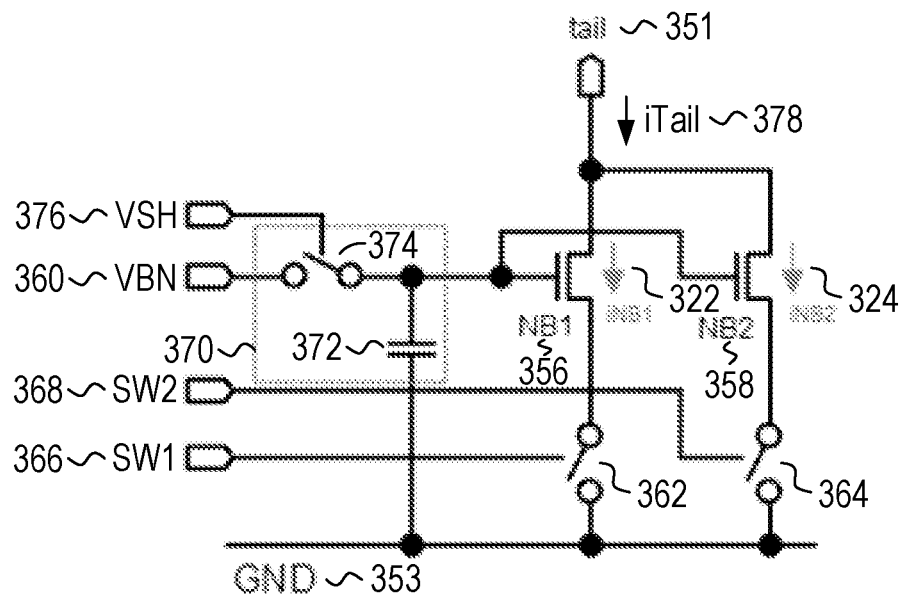

FIGS. 3A and 3B illustrate schematics of two examples of a tail current source 352 of a comparator coupled between a tail node 351 and a voltage node 353 in accordance with the teachings of the present disclosure. It is appreciated that the tail current source 352 of FIGS. 3A and 3B may be an example of the tail current source 252A included in the comparator 216A as shown in FIG. 2A, and that similarly named and numbered elements described above are coupled and function similarly below.

The tail current source 352 includes a first transistor NB1 356 and a second transistor NB2 358. In the illustrated example, the first and second transistors 356 and 358 are NMOS transistors, but other types of transistors can also be used (e.g., bipolar, PMOS). The first and second transistors 356 and 358 act as current sources configured to conduct currents iNB1 322 and iNB2 324, respectively, in response to a bias voltage source VBN 360. The currents iNB1 322 and iNB2 324 combine to generate the total tail current iTail 378 (i.e., iTail=iNB1+iNB2).

The tail current source 352 also includes a first switch 362, controlled by a first switch signal SW1 366, configured to selectively couple the first transistor 356 between a tail node 351 of the comparator and the voltage node 353, which as shown in the depicted example is coupled to ground. The tail current source 352 also includes a second switch 364, controlled by a second switch signal SW2 368, configured to selectively couple the second transistor 358 between the tail node 351 and ground. In various examples, the first and second transistors 356 and 358 are PMOS transistors, and are coupled between the tail node 351 and a power line (e.g., VDD) instead.

In FIG. 3A, the first and second switches 362 and 364 are above, coupled between the first and second transistors 356 and 358 and the tail node 351, respectively. When the switches 362 and 364 are above, parasitic capacitance (i.e., loading) on the tail node 351 can be larger due to the capacitance of the switches, but the transistors can be decoupled from the tail node 351 when not in use. In FIG. 3B, the first and second switches 362 and 364 are below, coupled between the first and second transistors 356 and 358 and ground, respectively. When the switches 362 and 364 are below, the switches 362 and 364 do not make loading on the tail node 351 larger, but the sources of the NMOS transistors 356 and 358 become higher impedance and can potentially affect the output tail current iTail 378 because the source voltage, and consequently the gate-source voltage, of the first and second transistors 356 and 358 can be changed during ADC (during which time the first and second switch signals SW1 366 and SW2 368 are on) after the bias voltage source VBN 360 is sampled (during which time the first and second switch signals SW1 366 and/or SW2 368 are off). However, the variation in the iTail 378 can be small enough for many applications. In various examples, the tail current source 352 includes only one of the first and second switches 362 and 364 (see discussion regarding FIG. 4A below). In various examples, the gates of the first and second transistors 356 and 358 are coupled to two separate bias voltage sources.

In the illustrated example, the tail current source 352 further includes an optional sample and hold circuit 370 coupled to the bias voltage source VBN 360, the gates of the first and second transistors 356 and 358, and ground. The sample and hold circuit 370 is configured to reduce the impact of noise from the bias voltage source VBN 360 on the ADC readouts by decoupling the first and second transistors 356 and 358 during the readout periods (e.g., ADC reset signal and image signal periods). The sample and hold circuit 370 includes a capacitor 372 coupled between the gates of the first and second transistors 356 and 358 and ground, and a sample and hold switch 374, controlled by sample and hold switch signal VSH 376, configured to selectively couple the capacitor 372 to the bias voltage source VBN 360. In various examples, the first and second transistors 356 and 358 are PMOS transistors, and the capacitor 372 is coupled to a power line instead of ground. During some or all auto-zero periods of the comparator, the sample and hold switch 374 is configured to be on such that the sample and hold circuit 370 samples a bias signal from the bias voltage source VBN 360. During ADC reset signal and image signal periods, the sample and hold switch 374 is configured to be off such that the sample and hold circuit 370 holds the bias signal. In various examples, the sample and hold circuit 370 has different configurations. In various examples, the tail current source 352 does not include the sample and hold circuit 370, and the gates of the first and second transistors 356 and 358 are coupled to the bias voltage source VBN 360 directly.

Figure 4A:
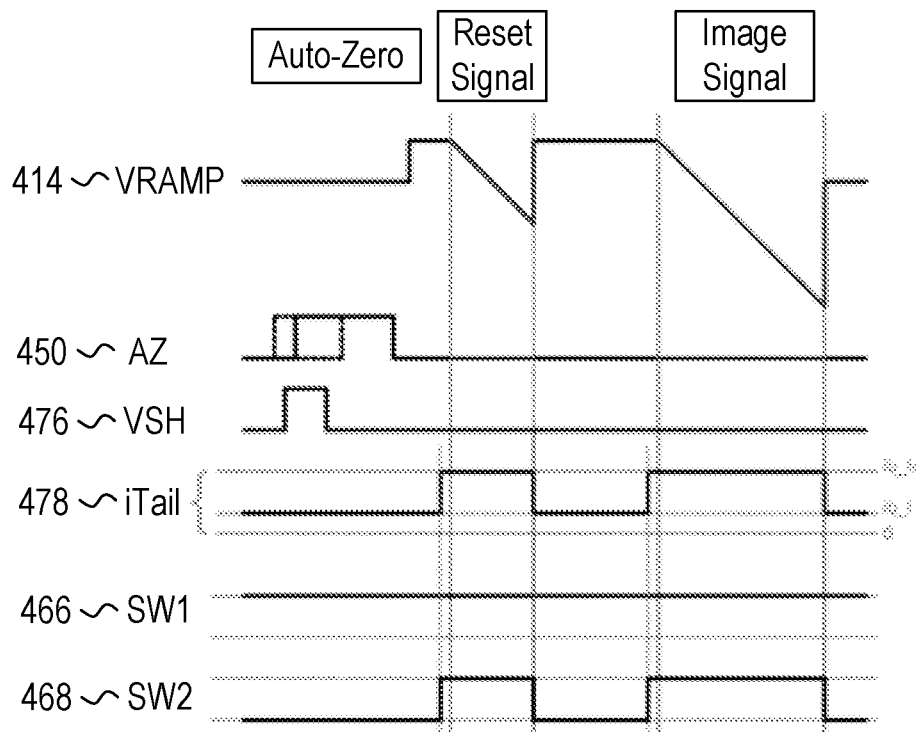
FIGS. 4A and 4B illustrate readout period timing diagrams of a comparator in an example readout circuit in accordance with the teachings of the present disclosure.
Figure 4B:
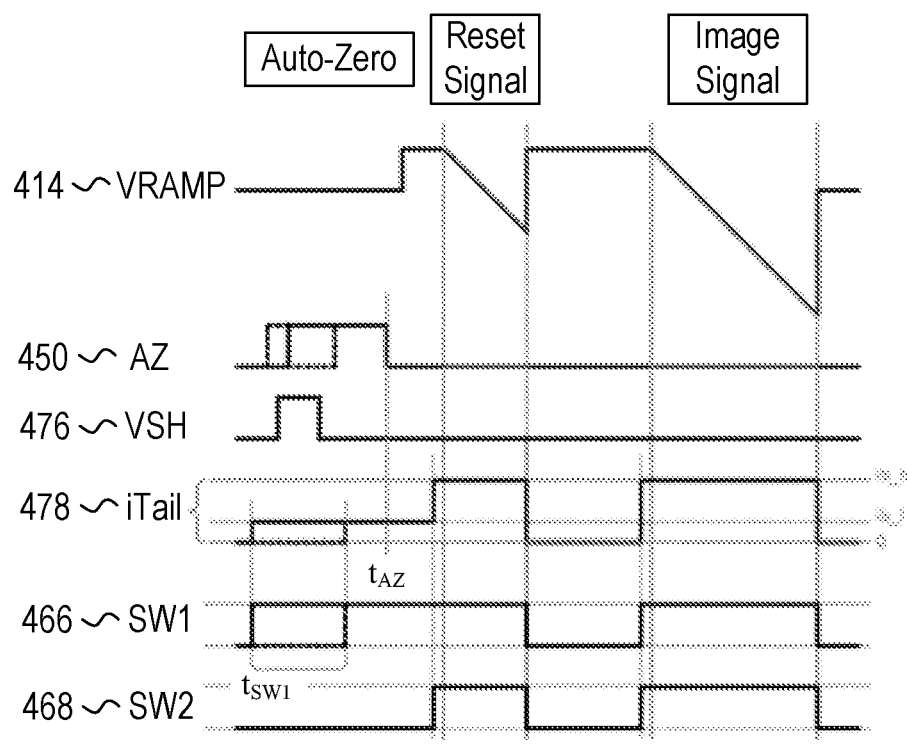

FIGS. 4A and 4B illustrate readout period timing diagrams of a comparator in an example readout circuit in accordance with the teachings of the present disclosure. In the illustrated example, the readout period includes, in order, an auto-zero period, an ADC reset signal period, a period between the ADC reset signal period and an ADC image signal period, the ADC image signal period, and a period after the ADC image signal period. It is appreciated that FIGS. 4A and 4B may be example readout period timing diagrams of the tail current source 352 illustrated in FIGS. 3A and 3B and the comparator 216A illustrated in FIG. 2A, and that similarly named and numbered elements described above are coupled and function similarly below.

During the auto-zero period, an auto-zero switch signal AZ 450 is pulsed to auto-zero switches coupled to a ramp generator output or a bitline. If the tail current source includes a sample and hold circuit, a sample and hold switch signal VSH 476 is also pulsed. In various examples, the sample and hold switch signal VSH 476 is not pulsed every auto-zero period (e.g., pulsed every other auto-zero period). As shown, the pulse of the auto-zero switch signal AZ 450 can vary in duration and timing relative to the pulse of the sample and hold switch signal VSH 476. After the signals AZ 450 and VSH 476 are pulsed, but before the ADC reset signal period, a ramp generator output VRAMP 414 changes value so that it can generate a sloped voltage output.

Furthermore, a first switch signal SW1 466 is configured to control a first switch coupled to a first transistor in the tail current source, and a second switch signal SW2 468 is configured to control a second switch coupled to a second transistor in the tail current source. In FIG. 4A, the first switch signal SW1 466 is configured to remain on during the entire readout period. In various examples, the tail current source does not include the first switch as it is unnecessary to operate the comparator according to the timing diagram illustrated in FIG. 4A. In FIG. 4B, the first switch signal SW1 466 is configured to either remain on during the auto-zero period or remain off for a time period $t_{SW1}$. In various examples, the time period $t_{SW1}$ ends sufficiently before an end time of the auto-zero switch pulse $t_{AZ}$ such that the settling error is minimal at the end time $t_{AZ}$. In both FIGS. 4A and 4B, the second switch signal SW2 468 is configured to remain off.

When each of the first and second switch signals SW1 466 and SW2 468 is on, the transistor coupled to the corresponding switch acts as a current source (e.g., generating current iNB1 222A or iNB2 224A as illustrated in FIG. 2A, respectively). The current generated by the two transistors combine to form total tail current iTail 478. As shown in FIGS. 4A and 4B, the total tail current iTail 478 is at a high value (i.e., ib_h) when both switch signals are on, is at a low value (i.e., ib_1) when only one of the switch signals is on, and is at 0 when both switch signals are off. The ratio between the high and low values of the total tail current iTail 478 can be controlled in various ways, as will be discussed below.

During the ADC reset signal period, the ramp generator output VRAMP 414 generates a sloped voltage output while the signals AZ 450 and VSH 476 are both off. The first switch signal SW1 466 is configured to remain on from the auto-zero period, while the second switch signal SW2 468 is configured to turn on and remain on such that the total tail current iTail 478 is at the high value. In the illustrated example, the second switch signal SW2 468 is configured to turn on slightly prior to the commencement of the ADC reset signal period. This ensures that the total tail current iTail 478 is at the high value throughout the entire ADC reset signal period.

During the period between the ADC reset signal and image signal periods, the second switch signal SW2 468 is configured to turn off and remain off. In FIG. 4A, the first switch signal SW1 466 is configured to remain on such that the total tail current iTail 478 is at the low value (since one switch is on and the other is off). In FIG. 4B, the first switch signal SW1 466 is configured to turn off and remain off such that the total tail current iTail 478 is 0 (since both switches are off).

During the ADC image signal period, both the first and second switch signals SW1 466 and SW2 468 are configured to turn on and/or remain on. Similar to before the ADC reset signal period, the second switch signal SW2 468 (and the first switch signal SW1 466 in FIG. 4B) is configured to turn on slightly prior to the commencement of the ADC image signal period to ensure that the total tail current iTail 478 is at the high value throughout the entire ADC image signal period.

During the period after the ADC image signal period, the second switch signal SW2 468 is configured to turn off and remain off, while the first switch signal is configured to either remain on such that the total tail current iTail 478 is at the low value (FIG. 4A) or also turn off and remain off such that the total tail current iTail 478 is 0 (FIG. 4B). In other words, the switches and the currents repeat their configurations during the period between the ADC reset signal and image signal periods.

One advantage of having and dynamically controlling switches coupled to transistors in the tail current source is reducing power consumption. In a typical CMOS image sensor, ADC consumes a large amount of power (e.g., 20-60% of total power consumption) while the comparator is one of the most power-demanding elements in the image sensor using single slope ADC (e.g., 30-70%). Therefore, by keeping one or more switches off during non-ADC signal readout periods, the total tail current generated is at a high value for a short period of time. For example, the average current can be reduced from 3 μA to 1.5 μA when the total tail current's high value is 3 μA, its low value is 0.75 μA, and the ADC period is about 30% of the row period. This advantage is particularly significant when a high frame rate is required, the row period is relatively short (related to the use of a higher clock frequency for ADC), and/or a higher bias current is required during the ADC period so that the comparator's delay is shorter.

FIGS. 5A, 5B, 5C and 5D illustrate schematics of four examples of a tail current source 552 of a comparator coupled between a tail node 551 and a voltage node 553 in accordance with the teachings of the present disclosure. It is appreciated that the tail current source 552 of FIGS. 5A-D may be an example of the tail current source 252A included in the comparator 216A as shown in FIG. 2A, and that similarly named and numbered elements described above are coupled and function similarly below.

The tail current source 552 includes a first transistor NB1 556 configured to act as a first current source conducting a first current iNB1 522 and a second transistor NB2 558 configured to act as a second current source conducting a second current iNB2 524, both in response to a bias voltage source VBN 560. The first and second currents iNB1 522 and iNB2 524 combine to form a total tail current iTail 578. The first and second transistors 556 and 558 are coupled to a first switch 562 and a second switch 564, respectively. The first and second switches 562 and 564 are controlled by first and second switch signals SW1 566 and SW2 568, respectively. In the illustrated examples, the first and second transistors 556 and 558 are NMOS transistors coupled to ground. In various examples, the first and second transistors 556 and 558 are PMOS transistors coupled to a power line instead.

The gates of the first and second transistors 556 and 558 are coupled to the bias voltage source VBN 560 via an optional first sample and hold circuit 570. The first sample and hold circuit 570 includes a first capacitor 572 coupled between the gates of the first and second transistors 556 and 558 and the voltage node 553, which as shown in the depicted example is coupled to ground, and a first sample and hold switch 574, controlled by first sample and hold switch signal VSH1 576, configured to selectively couple the first capacitor 572 to the bias voltage source VBN 560. The function of the first sample and hold circuit 570 is generally similar to that of the sample and hold circuit 370 illustrated in FIGS. 3A-B.

The tail current source 552 further includes a first cascode transistor 582. The examples illustrated in FIGS. 5B-D also include a second cascode transistor 584. The first and second cascode transistors 582 and 584 prevent the voltage at the tail node 551 of the comparator from affecting the tail current too much (e.g., keep the drain voltage, and consequently the drain-source voltage, of the first and second transistors 556 and 558 constant or prevent the voltage at the tail node 551 from affecting the gate voltage of the first and second transistors 556 and 558) and reduce the loading of the tail node 551. The gates of the first and second cascode transistors 582 and 584 are coupled to a cascode voltage source VCN 580 via an optional second sample and hold circuit 590. The second sample and hold circuit 590 includes a second capacitor 592 coupled between the gates of the first and second cascode transistors 582 and 584 and ground, and a second sample and hold switch 594, controlled by second sample and hold switch signal VSH2 596, configured to selectively couple the second capacitor 592 to the cascode voltage source VCN 580. The function of the second sample and hold circuit 590 is generally similar to that of the sample and hold circuit 370 illustrated in FIGS. 3A and 3B. In various examples, the first and second transistors 556 and 558 are PMOS transistors, and the first and second capacitors 572 and 592 are coupled to a power line instead of ground.

Figure 5A:
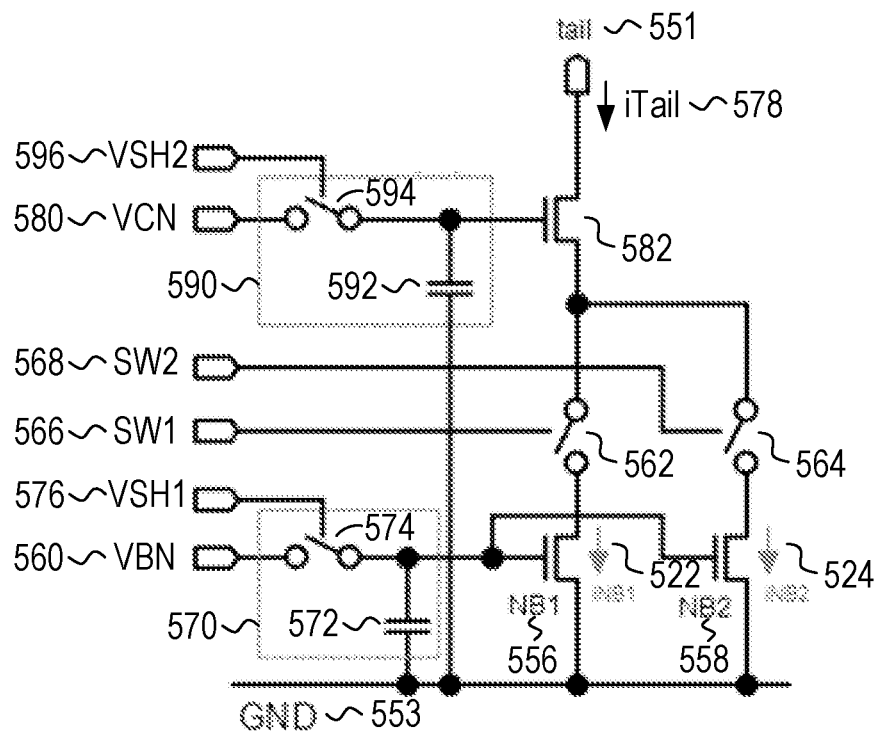
FIGS. 5A, 5B, 5C and 5D illustrate schematics of four examples of a tail current source of a comparator in accordance with the teachings of the present disclosure.

In the example illustrated in FIG. 5A, the tail current source 552 includes a single cascode transistor 582 coupled between the tail node 551 and the first and second switches 562 and 564. When at least one of the switches is on, the cascode transistor 582 operates in saturation region. Also, the switches 562 and 564 are separated from the tail node 551 such that parasitic capacitance and switch resistance at the tail node 551 is not as high, and the capacitances of the switches 562 and 564 do not affect the performance of the comparator. However, the source voltage of the cascode transistor 582 is affected by iTail 578 and this can affect the accuracy of iTail 578 when the switches 562 and 564 are turned on and off.

Figure 5B:
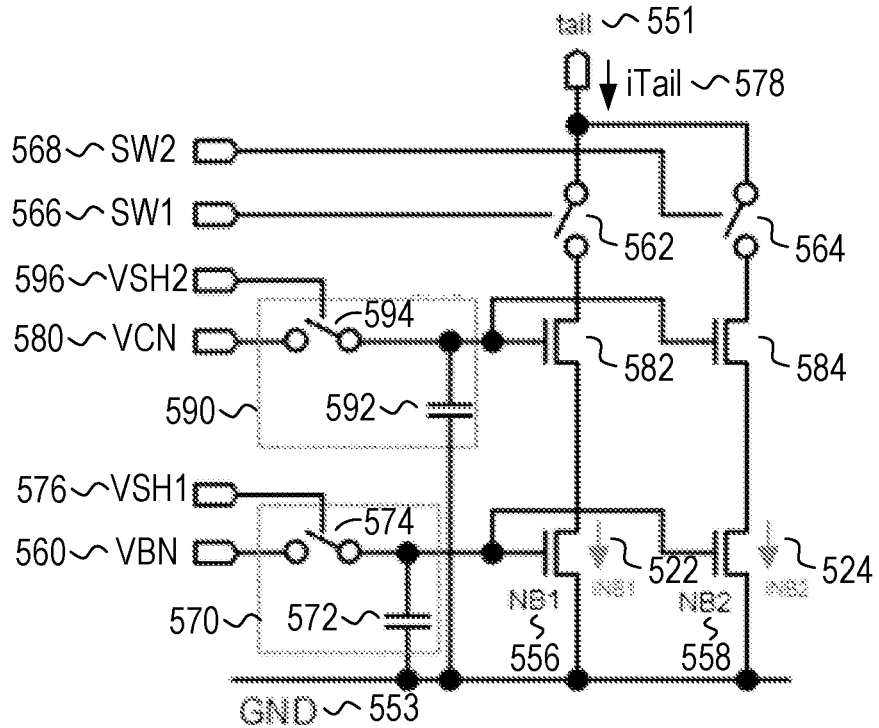

In the example illustrated in FIG. 5B, the first and second cascode transistors 582 and 584 are coupled between the first and second switches 562 and 564 and the first and second transistors 556 and 558, respectively. Unlike the example illustrated in FIG. 5A, the switches are directly coupled to the tail node 551 such that parasitic capacitance can affect the performance of the comparator. However, as aforementioned, this configuration is acceptable in many cases. In this configuration, the current density of the cascode transistors 582 and 584 can be kept the same when turning on and off either one of the switches 562 and 564, allowing sufficient current accuracy.

Figure 5C:
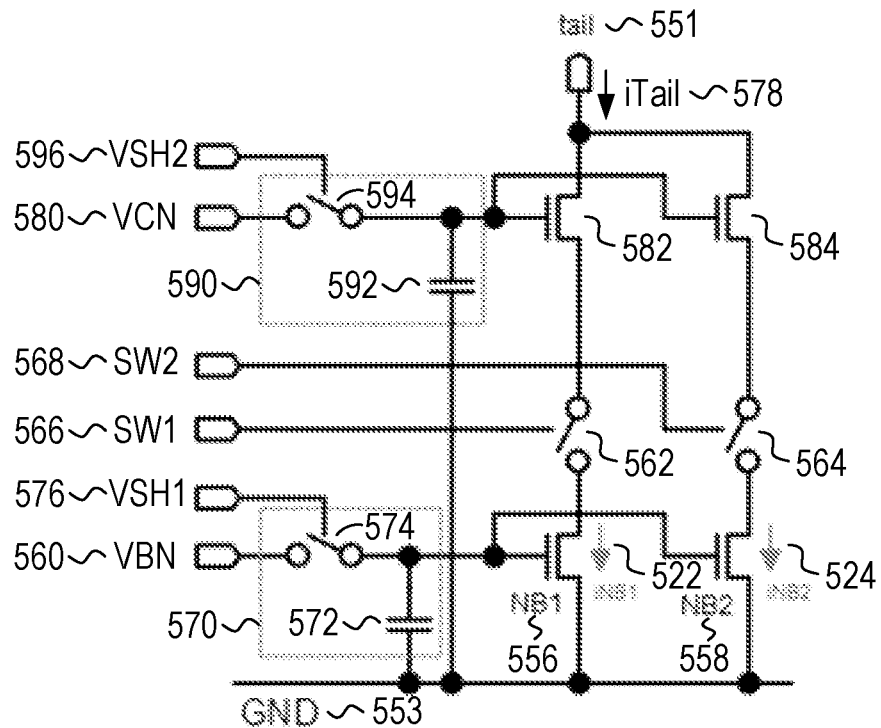

In the example illustrated in FIG. 5C, the first and second cascode transistors 582 and 584 are coupled between the tail node 551 and the first and second switches 562 and 564. The loading capacitance on the tail node 551 is relatively smaller (e.g., compared to the example illustrated in FIG. 5B) because the cascode transistors 582 and 584 typically operate in saturation region. While this configuration is similar to the example illustrated in FIG. 5A, this configuration has the added benefit that the $V_{GS}$ of the cascode transistors 582 and 584 do not change when the total tail current iTail 578 changes between the low and high values.

Figure 5D:
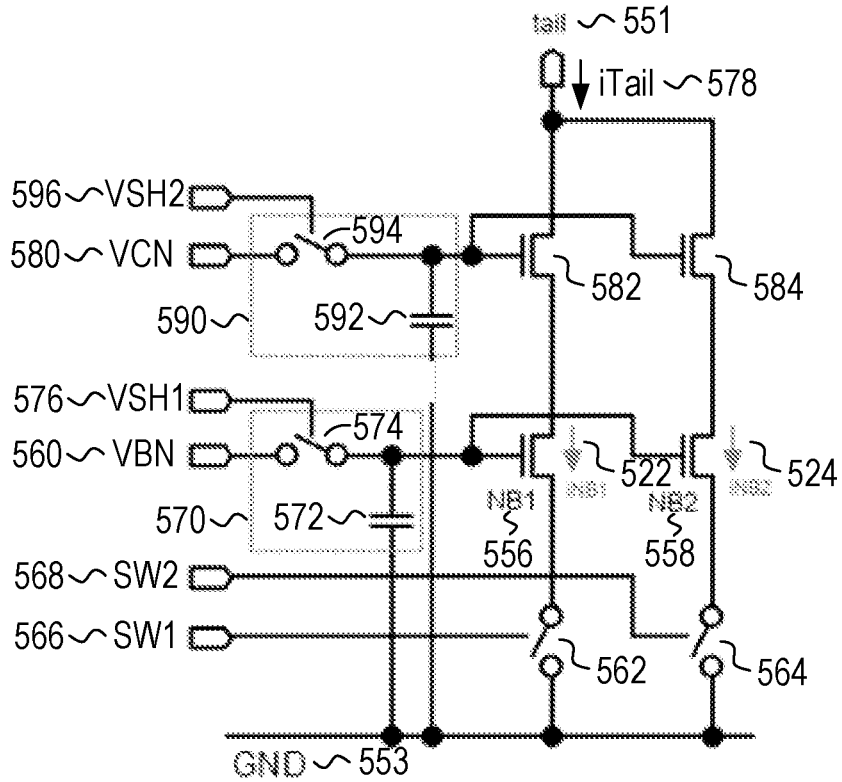

In the example illustrated in FIG. 5D, the first and second cascode transistors 582 and 584 are coupled directly to the tail node 551 as in FIG. 5C, but the switches 562 and 564 are below the transistors 556 and 558, similar to the example illustrated in FIG. 3B. In various examples, the circuit elements described above are arranged in different configurations.

Figure 6A:
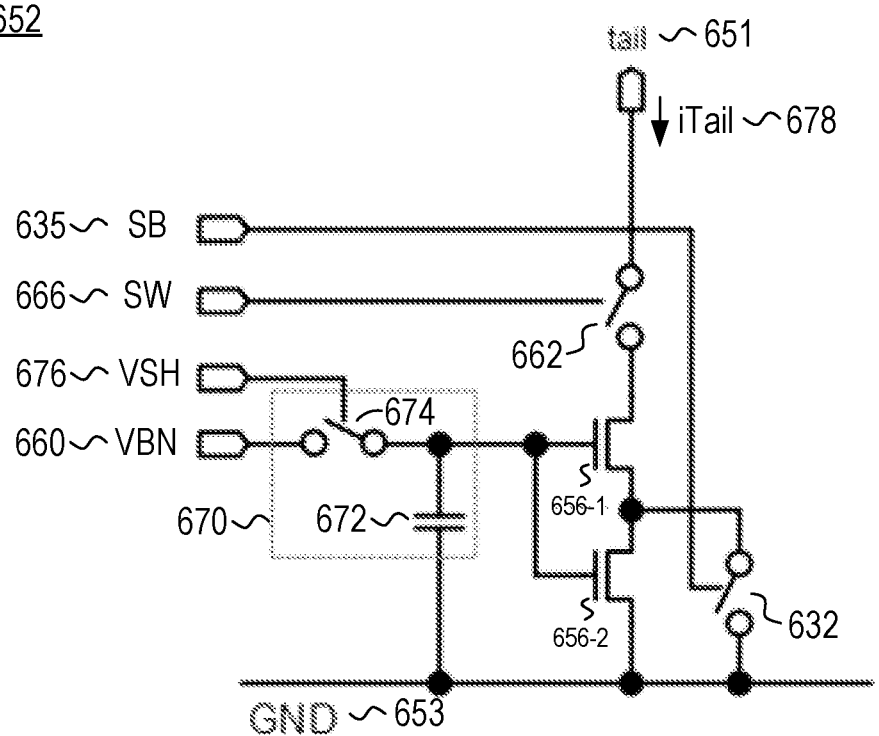
FIGS. 6A, 6B and 6C illustrate schematics of three examples of a tail current source of a comparator in accordance with the teachings of the present disclosure.
Figure 6B:
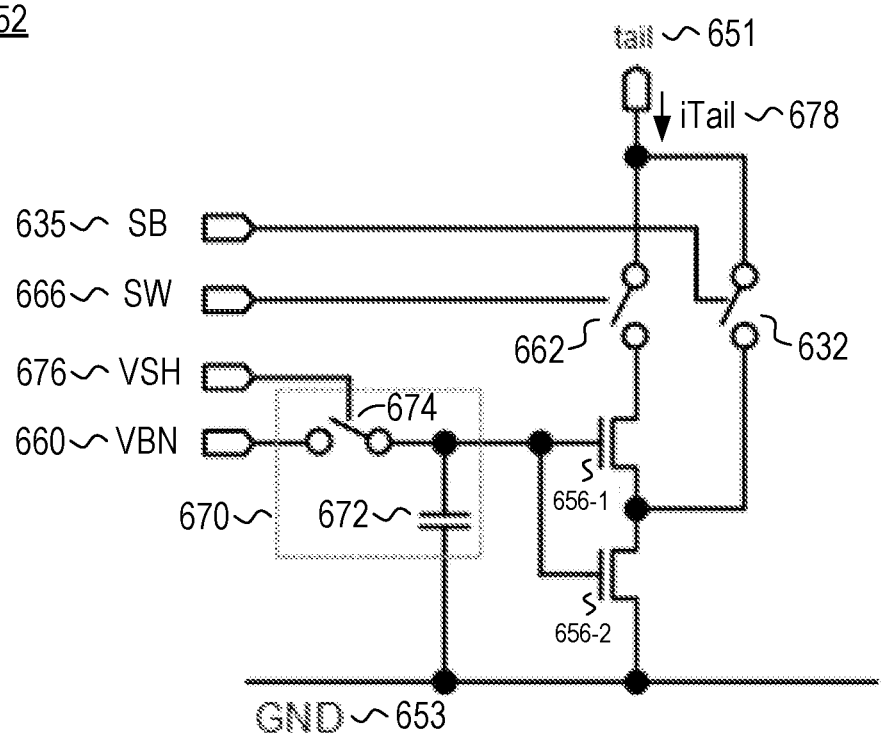
Figure 6C:
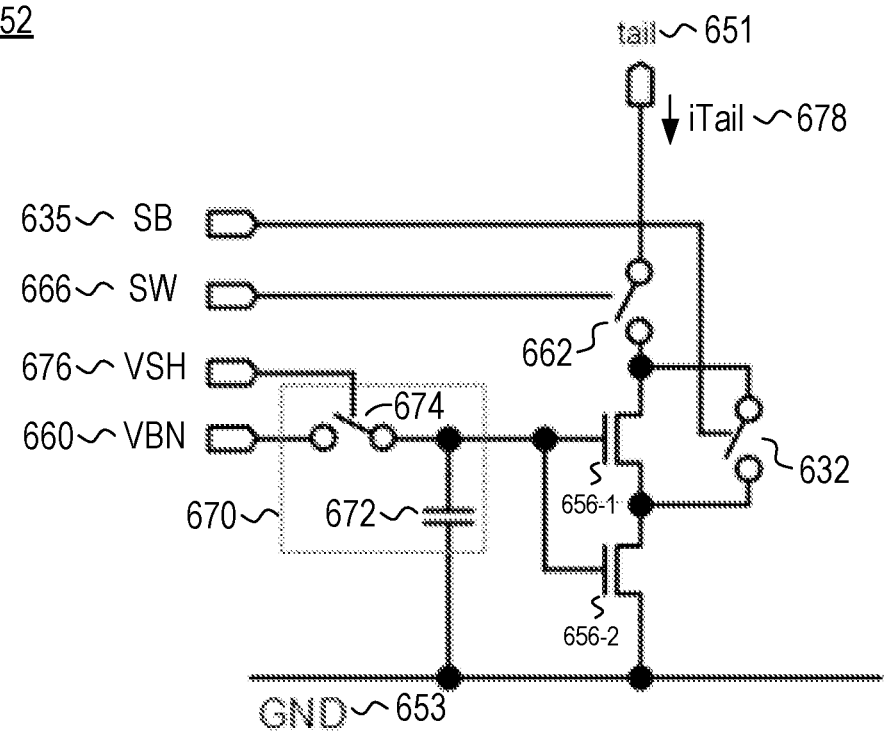

FIGS. 6A, 6B and 6C illustrate schematics of three examples of a tail current source 652 of a comparator coupled between a tail node 651 and a voltage node 653 in accordance with the teachings of the present disclosure. It is appreciated that the tail current source 652 of FIGS. 6A-C may be an example of the tail current source 252A included in the comparator 216A as shown in FIG. 2A, and that similarly named and numbered elements described above are coupled and function similarly below.

Another method of dynamically controlling the tail current is changing the effective length of the transistors. An additional transistor may be coupled to one of the two transistors in the tail current source (e.g., the first transistor 356 illustrated in FIGS. 3A-B) in series in order to change the effective length. In the examples illustrated in FIGS. 6A-C, first and second transistors 656-1 and 656-2 are coupled in series with each other and with a switch 662 between the tail node 651 and the voltage node 653, which as shown in the depicted example is coupled to ground. In the example, the switch 662 is controlled by switch signal SW 666. A bypass switch 632, which is controlled by bypass switch signal SB 635, can be coupled in parallel with the second transistor 656-2 (as shown in FIG. 6A), with the switch 662 and the first transistor 656-1 (as shown in FIG. 6B), or with the first transistor 656-1 (as shown in FIG. 6C). In various examples, the first and second transistors 656-1 and 656-2 are PMOS transistors, and are coupled between the tail node 651 and a power line (e.g., VDD) instead. In various examples, the circuit elements described above are arranged in different configurations.

In the illustrated examples, when the bypass switch signal SB 635 is turned on, the bypass switch 632 short circuits the tail current source 652. The second transistor 656-2 is bypassed in FIG. 6A, both the first transistor 656-1 and the switch 662 are bypassed in FIG. 6B, and the first transistor 656-1 is bypassed in FIG. 6C. Therefore, by turning on the bypass switch signal SB 635 and bypassing one of the transistors, the effective length of the transistor is reduced, the equivalent resistance is reduced, and the tail current iTail 678 can be increased.

Figure 7:
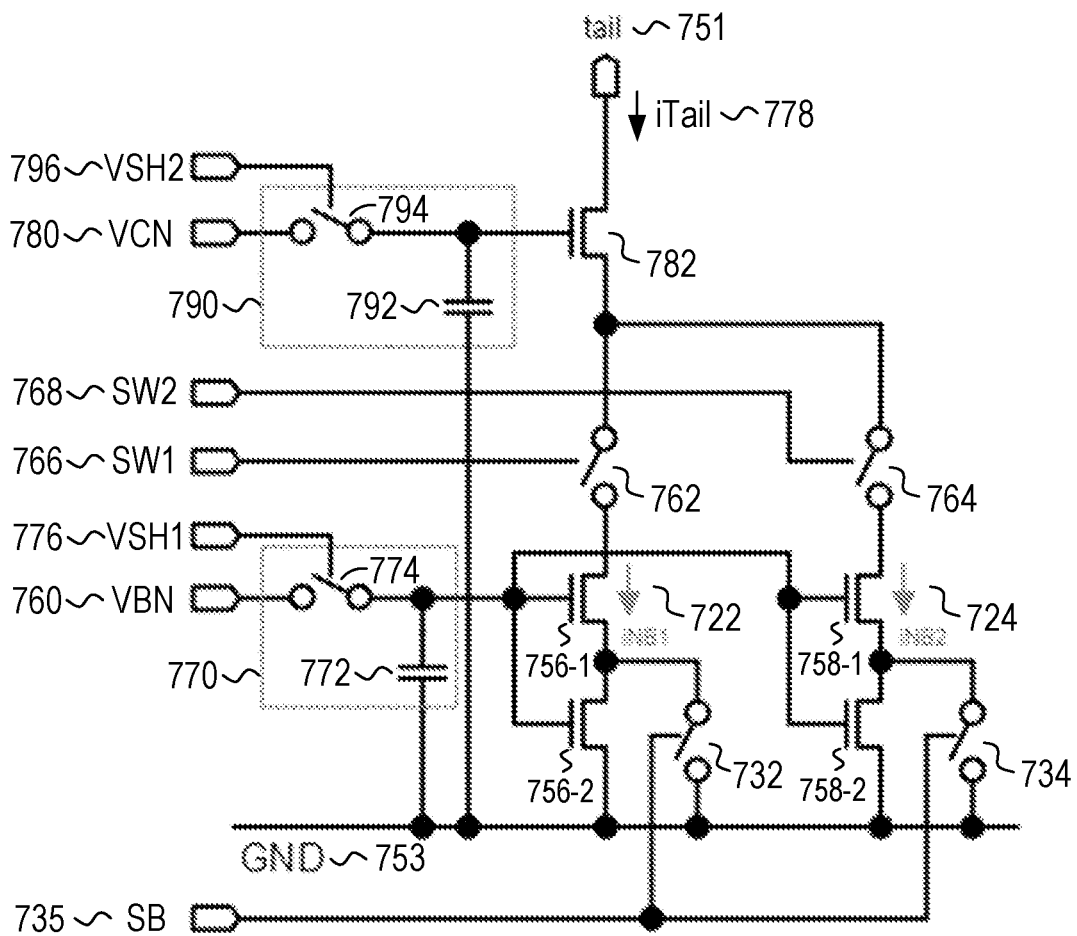
FIG. 7 illustrates a schematic of one example of a tail current source of a comparator in accordance with the teachings of the present disclosure.

FIG. 7 illustrates a schematic of one example of a tail current source 752 of a comparator coupled between a tail node 751 and a voltage node 753 in accordance with the teachings of the present disclosure. It is appreciated that the tail current source 752 of FIG. 7 may be an example of the tail current source 252A included in the comparator 216A as shown in FIG. 2A, and that similarly named and numbered elements described above are coupled and function similarly below.

As the effective lengths of the transistors can be changed to dynamically control the tail current (as illustrated in FIGS. 6A-C), the effective width, or both the effective length and width, of the transistors can also be changed to dynamically control the tail current. The tail current source 752 includes a first transistor 756-1, a second transistor 758-1, a third transistor 756-2 coupled in series with the first transistor 756-1, and a fourth transistor 758-2 coupled in series with the second transistor 758-1. In the illustrated example, the four transistors are NMOS transistors coupled to the voltage node 753, which as shown in the depicted example is coupled to ground. In various examples, the four transistors are PMOS transistors coupled to a power line (e.g., VDD) instead.

The gates of the four transistors are coupled to a bias voltage source VBN 760 via an optional first hold and sample circuit 770. The first transistor 756-1 and the third transistor 756-2 are coupled in series with a first switch 762, configured to be controlled by first switch signal SW1 766. The second transistor 758-1 and the fourth transistor 758-2 are coupled in series with a second switch 764, configured to be controlled by second switch signal SW2 768. The first and second switches 762 and 764 are both coupled to a cascode transistor 782. The gate of the cascode transistor 782 is coupled to a cascode voltage source via an optional second sample and hold circuit 790.

A first bypass switch 732 is coupled in parallel with the third transistor 756-2, and a second bypass switch 734 is coupled in parallel with the fourth transistor 758-2. In the illustrated example, both the first and second bypass switches 732 and 734 are controlled by the same bypass switch signal SB 735. In various examples, the first and second bypass switches 732 and 734 are controlled by two separate bypass switch signals.

The effective width of the transistors can be controlled via the first and second switches 762 and 764 (e.g., as discussed above with respect to FIGS. 3A-B), while the effective length of the transistors can be controlled via the first and second bypass switches 732 and 734 (e.g., as discussed above with respect to FIGS. 6A-C).

Figure 8A:
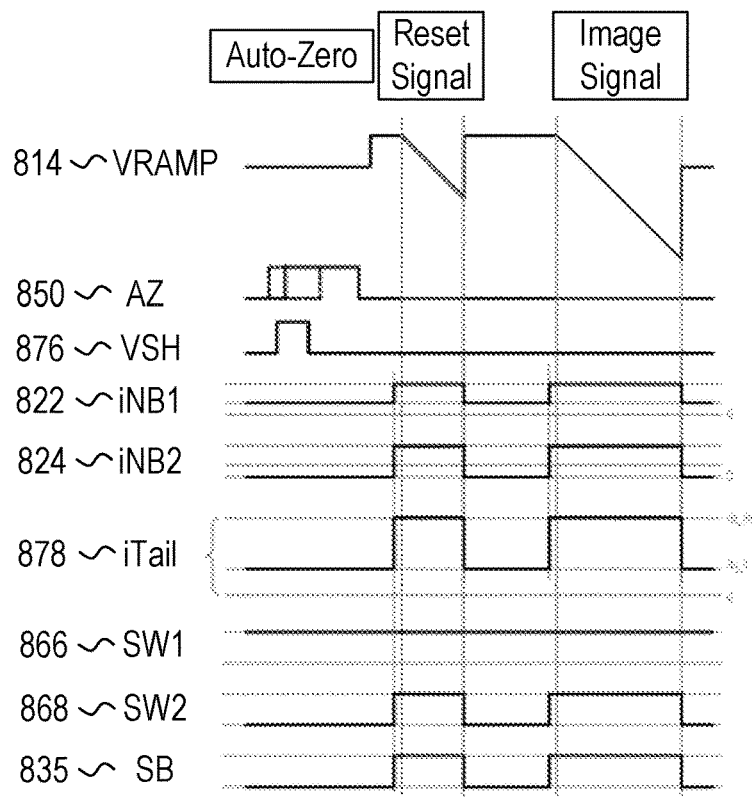
FIGS. 8A and 8B illustrate readout period timing diagrams of a comparator in an example readout circuit in accordance with the teachings of the present disclosure.
Figure 8B:
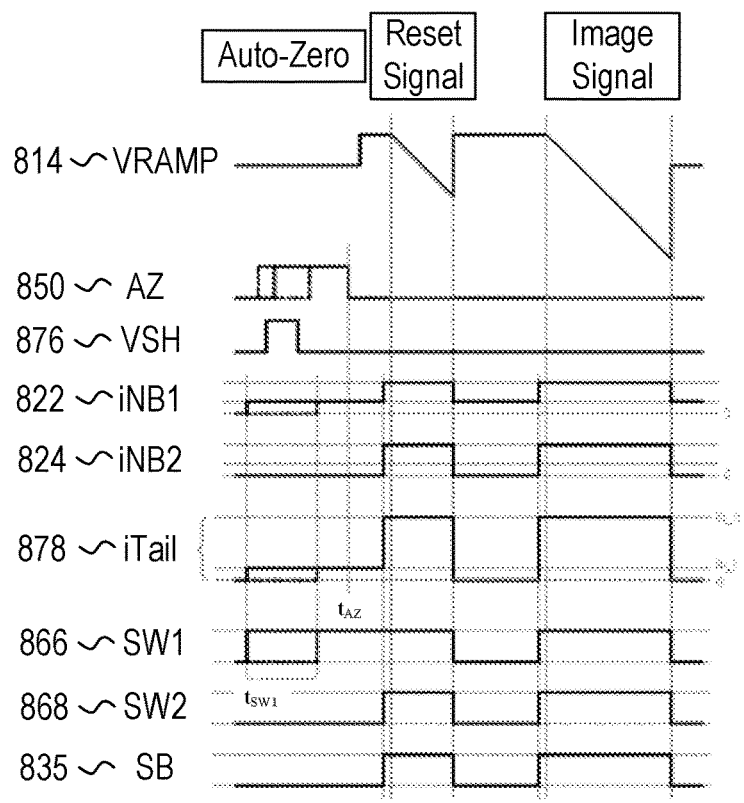

FIGS. 8A and 8B illustrate readout period timing diagrams of a comparator in an example readout circuit in accordance with the teachings of the present disclosure. In the illustrated example, the readout period includes, in order, an auto-zero period, an ADC reset signal period, a period between the ADC reset signal period and an ADC image signal period, the ADC image signal period, and a period after the ADC image signal period. It is appreciated that FIGS. 8A and 8B may be example readout period timing diagrams of the tail current source 752 illustrated in FIG. 7 and the comparator 216A illustrated in FIG. 2A, and that similarly named and numbered elements described above are coupled and function similarly below.

During the auto-zero period, an auto-zero switch signal AZ 850 is pulsed to auto-zero switches coupled to a ramp generator output or a bitline. If the tail current source includes a sample and hold circuit, a sample and hold switch signal VSH 876 is also pulsed. As shown, the pulse of the auto-zero switch signal AZ 850 can vary in duration and timing relative to the pulse of the sample and hold switch signal VSH 876. After the signals AZ 850 and VSH 876 are pulsed, but before the ADC reset signal period, a ramp generator output VRAMP 814 changes value so that it can generate a sloped voltage output.

Furthermore, a first switch signal SW1 866 is configured to control a first switch coupled to a first transistor and a third transistor in the tail current source, and a second switch signal SW2 868 is configured to control a second switch coupled to a second transistor and a fourth transistor in the tail current source. In FIG. 8A, the first switch signal SW1 866 is configured to remain on during the entire readout period. In various examples, the tail current source does not include the first switch as it is unnecessary to operate the comparator according to the timing diagram illustrated in FIG. 8A. In FIG. 8B, the first switch signal SW1 866 is configured to either remain on during the auto-zero period or remain off for a time period $t_{SW1}$. In various examples, the time period $t_{SW1}$ ends sufficiently before an end time of the auto-zero switch pulse $t_{AZ}$ such that the settling error is minimal at the end time $t_{AZ}$. In both FIGS. 8A and 8B, the second switch signal SW2 868 and a bypass switch signal SB 835 are configured to remain off.

When each of the first and second switch signals SW1 866 and SW2 868 is on, the transistors coupled to the corresponding switch act as current sources, generating current iNB1 822 or iNB2 824, respectively. Each of currents iNB1 822 and iNB2 824 can be at 0, a low value or a high value. Each current iNB1 822 and iNB2 824 is 0 when the first or second switch signal SW1 866 or SW2 868 is off. Each iNB1 822 and iNB2 824 is at a low value when the first or second switch signal SW1 866 or SW2 868 is on and the bypass switch signal SB 835 is off. This is because turning off the bypass switch signal SB 835 increases the effective length of the transistors, increasing the effective resistance, and thereby reducing the current generated. Each current iNB1 822 and iNB2 824 is at a high value when the first or second switch signal SW1 866 or SW2 868 is on and the bypass switch signal SB 835 is also on. This is because turning on the bypass switch signal SB 835 decreases the effective length of the transistors, decreasing the effective resistance, and thereby increasing the current generated. The currents iNB1 822 and iNB2 824 combine to form total tail current iTail 878. As shown in FIGS. 8A and 8B, the total tail current iTail 878 is at a high value (i.e., ib_h) when all three switch signals SW1 866, SW2 868, and SB 835 are on, is at a low value (i.e., ib_l) when one or two of the three switch signals are on (but either the first or second switch signals SW1 866 or SW2 868 must be on), and is at 0 when both the first and second switch signals SW1 866 and SW2 868 are off (e.g., whether the bypass switch signal SB 835 is on or off is irrelevant).

In various examples, the desired ratio between the high and low values of the total tail current iTail 878 can be controlled by changing the ratio between the W/L parameters of the transistors generating current iNB1 822 and the transistors generating current iNB2 824. The W/L parameter of a transistor is the ratio between its effective width and its effective length. As discussed with respect to FIGS. 6A-C and 7, the effective width and effective length can be changed via turning certain switches on or off. For example, if the W/L parameter of a first set of transistors (e.g., first and third transistors 756-1 and 756-2 illustrated in FIG. 7) is three times the W/L parameter of a second set of transistors (e.g., second and fourth transistors 758-1 and 758-2 illustrated in FIG. 7), then the current generated by the first set of transistors (e.g., iNB1 822) will be three times the current generated by the second set of transistors (e.g., iNB2 824). Accordingly, since iTail=iNB1+iNB2, the ratio between the high and low values of the total tail current iTail 878 (i.e., between ib_h and ib_1) can be configured to be 4:1 by only generating iNB2 for the low value, 4:3 by only generating iNB1 for the low value, etc.

During the ADC reset signal period, the ramp generator output VRAMP 814 generates a sloped voltage output while the signals AZ 850 and VSH 876 are both off. The first switch signal SW1 866 is configured to remain on from the auto-zero period, while the second switch signal SW2 868 and the bypass switch signal SB 835 are configured to turn on and remain on. As a result, the current iNB1 822 rises from the low value to the high value and the current iNB2 rises from 0 to the high value such that the total tail current iTail 878 rises to the high value. In the illustrated example, the second switch signal SW2 868 and the bypass switch signal SB 835 are configured to turn on slightly prior to the commencement of the ADC reset signal period. This ensures that the total tail current iTail 878 is at the high value throughout the entire ADC reset signal period.

During the period between the ADC reset signal and image signal periods, in FIG. 8A, the first switch signal SW1 866 is configured to remain on while both the second switch signal SW2 868 and the bypass switch signal SB 835 are configured to turn off and remain off such that the total tail current iTail 878 is at the low value (since one switch remains on). In FIG. 8B, the first and second switch signals SW1 866 and SW2 868 are configured to turn off and remain off such that the total tail current iTail 878 is 0 (since all switches are off).

During the ADC image signal period, all three switch signals SW1 866, SW2 868, and SB 835 are configured to turn on and/or remain on such that the total tail current iTail 878 is at the high value. Similar to before the ADC reset signal period, all three switch signals except for the first switch signal SW1 866 in FIG. 8A (which is always on) are configured to turn on slightly prior to the commencement of the ADC image signal period to ensure that the total tail current iTail 878 is at the high value throughout the entire ADC image signal period.

During the period after the ADC image signal period, the second switch signal SW2 868 and the bypass switch signal SB 835 are configured to turn off and remain off, while the first switch signal is configured to either remain on such that the total tail current iTail 878 is at the low value (FIG. 8A) or also turn off and remain off such that the total tail current iTail 878 is 0 (FIG. 8B). In other words, the switches and the currents repeat their configurations during the period between the ADC reset signal and image signal periods.

Figure 9A:
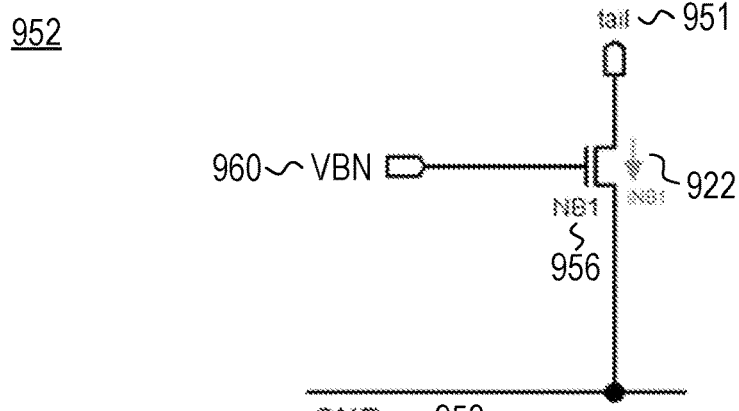
FIGS. 9A, 9B and 9C illustrate schematics of three examples of a tail current source of a comparator in accordance with the teachings of the present disclosure.
Figure 9B:
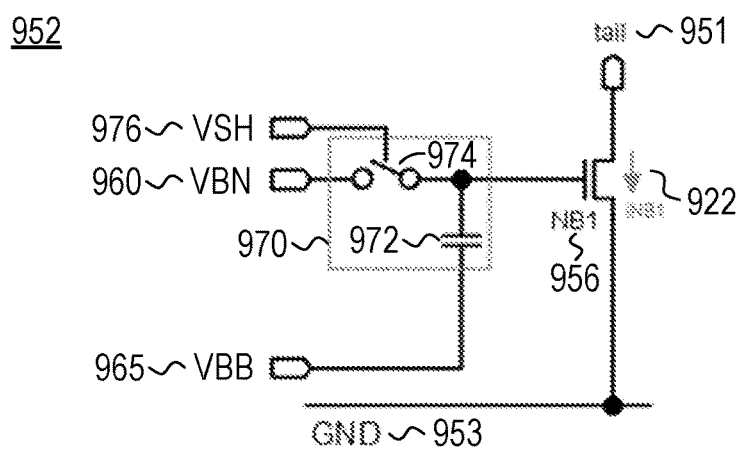
Figure 9C:
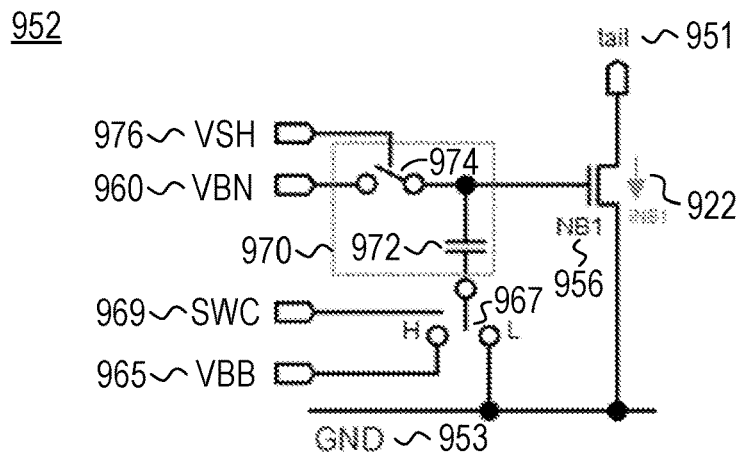

FIGS. 9A, 9B and 9C illustrate schematics of three examples of a tail current source 952 of a comparator coupled between a tail node 951 and a voltage node 953 in accordance with the teachings of the present disclosure. It is appreciated that the tail current source 952 of FIGS. 9A, 9B and 9C may be an example of the tail current source 252A included in the comparator 216A as shown in FIG. 2A, and that similarly named and numbered elements described above are coupled and function similarly below.

Another method of dynamically controlling the tail current is changing the bias voltage source coupled to the gates of the transistors. In the example illustrated in FIG. 9A, the gate of transistor 956 is directly coupled to bias voltage source VBN 960. Changing the bias voltage source VBN 960 changes the current iNB1 922 flowing through the transistor 956. In various examples, the gate of transistor 956 is coupled to the bias voltage source VBN 960 via a sample and hold circuit (not shown in FIG. 9A).

In the example illustrated in FIG. 9B, the gate of the transistor 956 is coupled to the first bias voltage source VBN 960 via a sample and hold circuit 970. The sample and hold circuit 970 includes a capacitor 972 coupled between the gate of the transistors 956 and a second bias voltage source VBB 965, and a sample and hold switch 974, controlled by sample and hold switch signal VSH 976, configured to selectively couple the capacitor 972 to the first bias voltage source VBN 960. The first bias voltage source VBN 960 is first sampled and held, then the second bias voltage source VBB 965 is changed to control the voltage at the gate of transistor 956, thereby changing the current iNB1 922 flowing through.

In the example illustrated in FIG. 9C, the capacitor 972 is coupled to switch 967, configured to be controlled by switch signal SWC 969. When the switch signal SWC 969 is high, the capacitor 972 is coupled to the second bias voltage source VBB 965, similar to the example illustrated in FIG. 9B. When the switch signal SWC 969 is low, the capacitor 972 is coupled to ground. The first bias voltage source VBN 960 is first sampled and held, then the switch 967 is toggled (e.g., instead of changing either the first or second bias voltage sources VBN 960 or VBB 965) to control the voltage at the gate of transistor 956, thereby changing the current iNB1 922 flowing through.

In the illustrated examples, the transistor 956 is an NMOS transistor coupled between the tail node 951 of the comparator and a voltage node 953, which as shown in the depicted example is coupled to ground. In various examples, the transistor 956 is a PMOS transistor coupled to a power line (e.g., VDD) instead of ground.

Figure 10A:
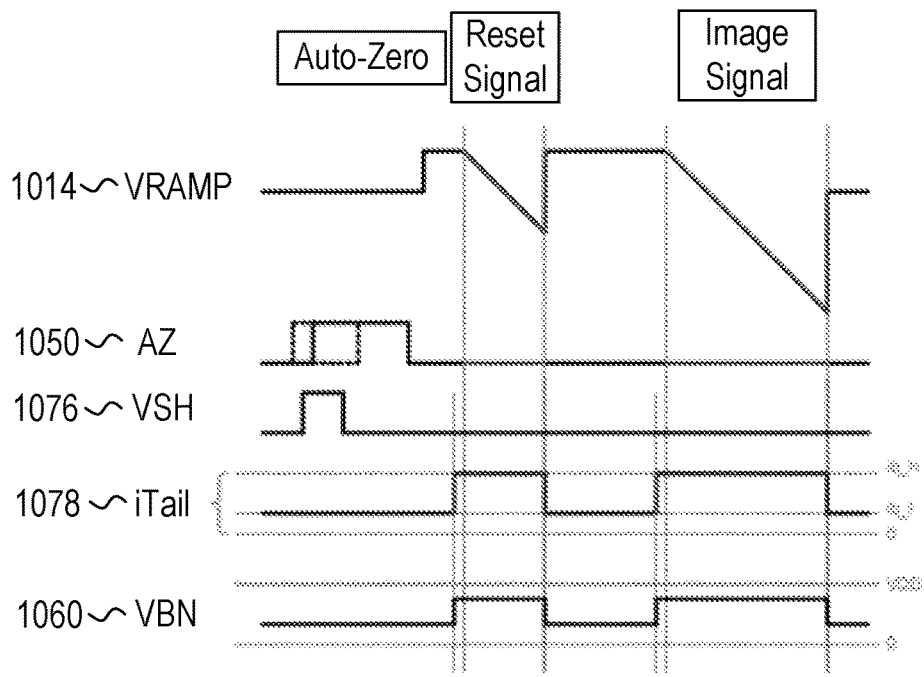
FIGS. 10A, 10B, and 10C illustrate readout period timing diagrams of a comparator in an example readout circuit in accordance with the teachings of the present disclosure.
Figure 10B:
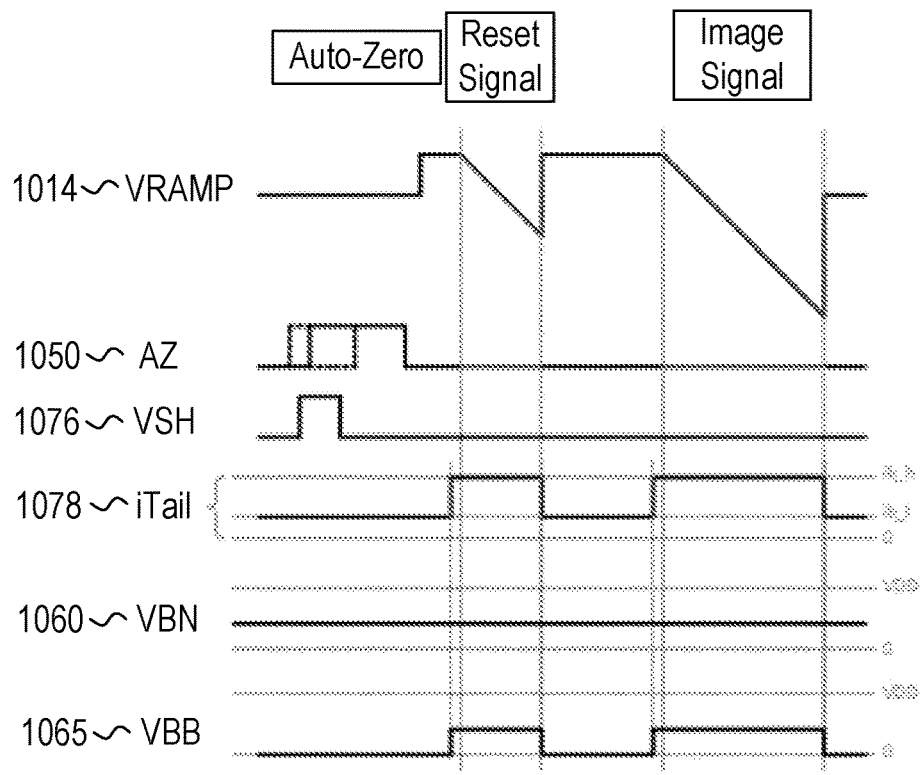
Figure 10C:
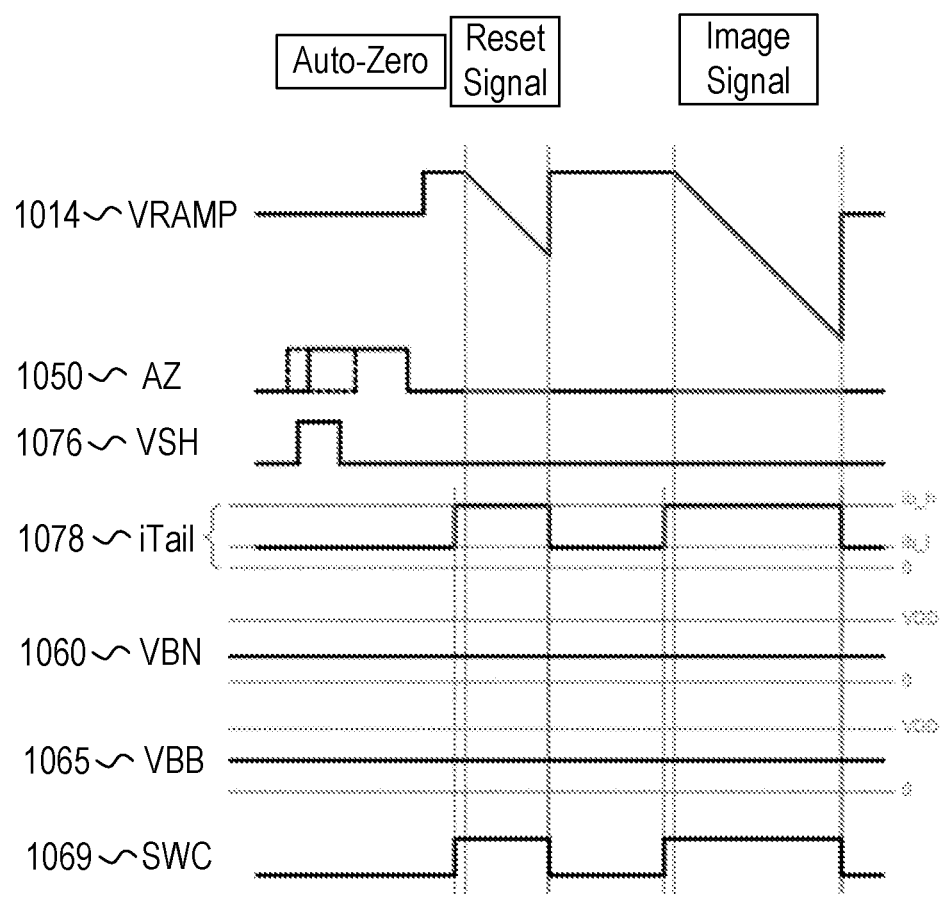

FIGS. 10A, 10B, and 10C illustrate readout period timing diagrams of a comparator in an example readout circuit in accordance with the teachings of the present disclosure. In the illustrated example, the readout period includes, in order, an auto-zero period, an ADC reset signal period, a period between the ADC reset signal period and an ADC image signal period, the ADC image signal period, and a period after the ADC image signal period. It is appreciated that FIGS. 10A-C may be example readout period timing diagrams of the tail current source 952 illustrated in FIGS. 9A-C and the comparator 216A illustrated in FIG. 2A, and that similarly named and numbered elements described above are coupled and function similarly below.

During the auto-zero period, an auto-zero switch signal AZ 1050 is pulsed to auto-zero switches coupled to a ramp generator output or a bitline. If the tail current source includes a sample and hold circuit, a sample and hold switch signal VSH 1076 is also pulsed. As shown, the pulse of the auto-zero switch signal AZ 1050 can vary in duration and timing relative to the pulse of the sample and hold switch signal VSH 1076. After the signals AZ 1050 and VSH 1076 are pulsed, but before the ADC reset signal period, a ramp generator output VRAMP 1014 changes value so that it can generate a sloped voltage output.

In the example illustrated in FIG. 10A, there is only one bias voltage source, so the total tail current iTail 1078 tracks the bias voltage source VBN 1060. The bias voltage source VBN 1060 is kept at a low value (e.g., above zero but below VDD, as shown) during non-ADC signal readout periods to reduce power consumption, but is kept at a high value (e.g., above zero but below VDD, as shown) during ADC signal readout periods such that the total tail current iTail 1078 is at the high value (e.g., ib_h).

In the example illustrated in FIG. 10B, there are two bias voltage sources. The first bias voltage source VBN 1060 is kept constant at an intermediate value (e.g., above zero but below VDD, as shown) throughout. The second bias voltage source VBB 1065 is kept at 0 during non-ADC signal readout periods to reduce power consumption such that the total tail current iTail 1078 is at the low value (e.g., ib_1). The second bias voltage source VBB 1065 is kept at an intermediate value (e.g., above or equal to zero but below or equal to VDD, as shown) during ADC signal readout periods such that the total tail current iTail 1078 is at the high value (e.g., ib_h).

In the example illustrated in FIG. 10C, there are two bias voltage sources. Both the first and second bias voltage sources VBN 1060 and VBB 1065 are kept constant at an intermediate value (e.g., above but below or equal to VDD, as shown) throughout. During non-ADC signal readout periods, the switch signal SWC 1069 is kept at a low value such that the capacitor coupled to the gate of the transistor (e.g., capacitor 972 illustrated in FIG. 9B-C) is coupled to ground. As a result, the total tail current iTail 1078 is at the low value (e.g., ib_1) since the transistor is effectively coupled only to the first bias voltage source VBN 1060. During ADC signal readout periods, the switch signal SWC 1069 is kept at a high value such that the capacitor coupled to the gate of the transistor (e.g., capacitor 972 illustrated in FIG. 9B-C) is coupled to the second bias voltage source VBB 1065. As a result, the total tail current iTail 1078 is at the high value (e.g., ib_h) since the transistor is coupled to both bias voltage sources VBN 1060 and VBB 1065.

In FIGS. 10A, 10B, and 10C, the values that increase for the ADC signal readout periods may do so slightly before the actual ADC signal readout periods, as shown. This ensures that the total tail current iTail 1078 is at the high value throughout the entire ADC signal readout periods. In various examples, the values increase at other times (e.g., when the ADC signal readout periods actually begin). In various examples, the values of the bias voltage sources, the switch, and the current are different from the illustrated examples. For example, the total tail current iTail 1078 can be configured to be at 0 between the ADC reset signal and image signal periods.

One drawback of dynamically controlling the current by changing the bias voltage source (e.g., VBN 1060, VBB 1065) is that the settling error from changing the voltage value between 0, low, and high values can have a significant effect on the current generated. One method of compensating for this is to allow more time for the voltage signal to settle, but this requires increased power consumption because the voltage must be at the high value for a longer period of time. While the example illustrated in FIG. 10C does not have voltage values that change value, changing the switch can induce noise in the second bias voltage source VBB 1065, so the settling issue remains.

In various examples, the method of changing the W/L parameter of the transistors (described with respect to FIGS. 6A-C, 7, and 8A-B) can be combined with the method of changing the bias voltage source(s) coupled to the gates of the transistors to dynamically control the tail current.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A tail current source of a comparator, comprising:
   a first transistor configured to operate as a first current source, wherein the first transistor is coupled between a tail node of the comparator and a voltage node, wherein the tail node comprises a node coupled to first and second inputs of the comparator;
   a second transistor configured to operate as a second current source;
   a switch configured to selectively couple the second transistor between the tail node of the comparator and the voltage node; and
   a bias voltage source coupled to gates of the first and second transistors,
   wherein the switch is configured to be on during an analog-to-digital conversion (ADC) reset signal period and an ADC image signal period, and
   wherein the switch is configured to be off during an auto-zero period, a period between the ADC reset signal and image signal periods, and a period after the ADC image signal period.

2. The tail current source of claim 1, wherein the voltage node is coupled to ground.

3. The tail current source of claim 1, wherein the voltage node is coupled to a power line.

4. The tail current source of claim 1, wherein the switch is a second switch, wherein the tail current source further comprises a first switch configured to selectively couple the first transistor between the tail node of the comparator and the voltage node.

5. The tail current source of claim 4, wherein the first and second switches are configured to be turned on prior to a commencement of the ADC reset signal period, and wherein the first and second switches are configured to be turned on prior to a commencement of the ADC image signal period.

6. The tail current source of claim 1, further comprising a sample and hold circuit coupled to the bias voltage source, the gates of the first and second transistors, and the voltage node, wherein the sample and hold circuit comprises:
   a capacitor coupled between the gates of the first and second transistors and the voltage node; and
   a sample and hold switch configured to selectively couple the capacitor to the bias voltage source,
   wherein the sample and hold switch is configured to be on during at least a portion of the auto-zero period such that the sample and hold circuit samples a bias signal from the bias voltage source, and wherein the sample and hold switch is configured to be off during the ADC reset signal and image signal periods such that the sample and hold circuit holds the bias signal.

7. The tail current source of claim 4, wherein the first switch is configured to be on during the auto-zero period, the ADC reset signal and image signal periods, and configured to be off during the period between the ADC reset signal and image signal periods and the period after the ADC image signal period, and wherein the second switch is configured to be off during the auto-zero period, the period between the ADC reset signal and image signal periods, and the period after the ADC image signal period, and configured to be on during the ADC reset signal and image signal periods.

8. The tail current source of claim 4, wherein the first switch is configured to be on during the auto-zero period, the ADC reset signal and image signal periods, the period between the ADC reset signal and image signal periods, and the period after the ADC image signal period, and wherein the second switch is configured to be off during the auto-zero period, the period between the ADC reset signal and image signal periods, and the period after the ADC image signal period, and configured to be on during the ADC reset signal and image signal periods.

9. The tail current source of claim 4, further comprising:
a cascode transistor coupled between the tail node of the comparator and the first and second switches; and
a cascode voltage source coupled to a gate of the cascode transistor.

10. The tail current source of claim 4, further comprising:
a first cascode transistor coupled to the first switch, wherein the first cascode transistor, the first switch, and the first transistor are coupled between the tail node of the comparator and the voltage node;
a second cascode transistor coupled to the second switch, wherein the second cascode transistor, the second switch, and the second transistor are coupled between the tail node of the comparator and the voltage node; and
a cascode voltage source coupled to a gate of the first cascode transistor and a gate of the second cascode transistor.

11. The tail current source of claim 10, further comprising a sample and hold circuit coupled to the cascode voltage source, the gate of the first cascode transistor, the gate of the second cascode transistor, and the voltage node, wherein the sample and hold circuit comprises:
a capacitor coupled between the gates of the first and second cascode transistors and the voltage node; and
a sample and hold switch configured to selectively couple the capacitor to the cascode voltage source,
wherein the sample and hold switch is configured to be on during at least a portion of the auto-zero period such that the sample and hold circuit samples a cascode signal from the cascode voltage source, and
wherein the sample and hold switch is configured to be off during the ADC reset signal and image signal periods such that the sample and hold circuit holds the cascode signal.

12. The tail current source of claim 1, wherein the first and second transistors are coupled in series, and wherein the switch is a first switch, and wherein the tail current source further comprises a second switch configured to selectively couple a node between the first and second transistors and one of the tail node and the voltage node.

13. A method of operating a tail current source of a comparator, comprising:

configuring a switch to selectively couple a first transistor between a tail node of the comparator and a voltage node, wherein the tail node comprises a node coupled to first and second inputs of the comparator;
coupling a bias voltage source to gates of the first transistor and a second transistor, wherein the second transistor is coupled between the tail node of the comparator and the voltage node; and
configuring the switch to be on during an analog-to-digital conversion (ADC) reset signal period and an ADC image signal period, and off during an auto-zero period, a period between the ADC reset signal period and the ADC image signal period, and a period after the ADC image signal period.

14. The method of claim 13, wherein the voltage node is coupled to ground.

15. The method of claim 13, wherein the voltage node is coupled to a power line.

16. The method of claim 13, wherein the switch is a first switch, and wherein the method further comprises:
configuring a second switch to selectively couple the second transistor between the tail node of the comparator and the voltage node.

17. The method of claim 16, further comprising:
configuring width-to-length ratios of the first and second transistors based on a desired ratio between a tail current high value and a tail current low value.

18. The method of claim 13, further comprising:
configuring the switch to be turned on prior to a commencement of the ADC reset signal period; and
configuring the switch to be turned on prior to a commencement of the ADC image signal period.

19. The method of claim 13, further comprising:
coupling a sample and hold circuit to the bias voltage source, the gates of the first and second transistors, and the voltage node, wherein the sample and hold circuit comprises:
a capacitor coupled between the gates of the first and second transistors and the voltage node; and
a sample and hold switch configured to selectively couple the capacitor to the bias voltage source,
wherein the sample and hold switch is configured to be on during at least a portion of the auto-zero period such that the sample and hold circuit samples a bias signal from the bias voltage source, and
wherein the sample and hold switch is configured to be off during the ADC reset signal and image signal periods such that the sample and hold circuit holds the bias signal.

20. The method of claim 16, further comprising:
configuring the first switch to be on during the auto-zero period and the ADC reset signal and image signal periods;
configuring the first switch to be off during the period between the ADC reset signal and image signal periods and the period after the ADC image signal period;
configuring the second switch to be on during the ADC reset signal and image signal periods; and
configuring the second switch to be off during the auto-zero period, the period between the ADC reset signal and image signal periods, and the period after the ADC image signal period.

21. The method of claim 16, further comprising:
coupling a cascode transistor between the tail node of the comparator and the first and second switches; and
coupling a cascode voltage source to a gate of the cascode transistor.

22. The method of claim 16, further comprising:
coupling a first cascode transistor to the first switch, wherein the first cascode transistor, the first switch, and the first transistor are coupled between the tail node of the comparator and the voltage node;
coupling a second cascode transistor to the second switch, wherein the second cascode transistor, the second switch, and the second transistor are coupled between the tail node of the comparator and the voltage node; and
coupling a cascode voltage source to a gate of the first cascode transistor and a gate of the second cascode transistor.

23. The method of claim 22, further comprising:
coupling a sample and hold circuit to the cascode voltage source, the gates of the first and second cascode transistors, and the voltage node, wherein the sample and hold circuit comprises:
   a capacitor coupled between the gates of the first and second cascode transistors and the voltage node; and
   a sample and hold switch configured to selectively couple the capacitor to the cascode voltage source;
configuring the sample and hold switch to be on during at least a portion of the auto-zero period such that the sample and hold circuit samples a cascode signal from the cascode voltage source; and
configuring the sample and hold switch to be off during the ADC reset signal and image signal periods such that the sample and hold circuit holds the cascode signal.

24. A method of operating a tail current source of a comparator, comprising:
coupling a transistor between a tail node of the comparator and a voltage node, wherein the tail node comprises a node coupled to first and second inputs of the comparator;
coupling a bias voltage source to a gate of the transistor;
configuring the transistor to conduct a tail current in response to the bias voltage source during an analog-to-digital conversion (ADC) reset signal period and an ADC image signal period; and
configuring the transistor not to conduct the tail current during an auto-zero period, a period between the ADC reset signal period and the ADC image signal period, and a period after the ADC image signal period.

25. The method of claim 24, wherein the voltage node is coupled to ground.

26. The method of claim 24, wherein the voltage node is coupled to a power line.

27. The method of claim 24, wherein the bias voltage source is a first bias voltage source, and wherein the method further comprises:
coupling a sample and hold circuit between the gate of the transistor and the first bias voltage source, wherein sample and hold circuit comprises:
   a capacitor having a first end and a second end, wherein the first end of the capacitor is coupled to the gate of the transistor, wherein the second end of the capacitor is coupled to a second bias voltage source; and
   a sample and hold switch configured to selectively couple the first end of the capacitor to the first bias voltage source; and
adjusting the second bias voltage source based on a desired tail current value.

28. The method of claim 27, further comprising:
selectively coupling the second end of the capacitor to one of the second bias voltage source and the voltage node.

* * * * *